(12) United States Patent
Iwashige et al.

(10) Patent No.: US 11,557,563 B2
(45) Date of Patent: Jan. 17, 2023

(54) SINTER SHEET, SEMICONDUCTOR DEVICE AND MANUFACTURING METHOD THEREOF

(71) Applicant: DENSO CORPORATION, Kariya (JP)

(72) Inventors: Tomohito Iwashige, Kariya (JP); Katsuya Kumagai, Kariya (JP); Takeshi Endoh, Kariya (JP)

(73) Assignee: DENSO CORPORATION, Kariya (JP)

( * ) Notice: Subject to any disclaimer, the term of this patent is extended or adjusted under 35 U.S.C. 154(b) by 138 days.

(21) Appl. No.: 16/902,584

(22) Filed: Jun. 16, 2020

(65) Prior Publication Data
US 2020/0402944 A1 Dec. 24, 2020

(30) Foreign Application Priority Data

Jun. 20, 2019 (JP) .............................. JP2019-114680

(51) Int. Cl.
*H01L 23/00* (2006.01)
(52) U.S. Cl.
CPC .............. *H01L 24/29* (2013.01); *H01L 24/83* (2013.01); *H01L 2224/29019* (2013.01); *H01L 2224/29239* (2013.01); *H01L 2224/29247* (2013.01); *H01L 2224/8384* (2013.01)
(58) Field of Classification Search
CPC . H01L 2224/83345; H01L 2224/83365; H01L 2224/83385; H01L 2224/8384; H01L 2224/27505
See application file for complete search history.

(56) References Cited

U.S. PATENT DOCUMENTS

2016/0099199 A1* 4/2016 Viswanathan .......... H01L 24/05
257/666

FOREIGN PATENT DOCUMENTS

| JP | H11-017050 A | 1/1999 |
| JP | H11-121527 A | 4/1999 |
| JP | 2001-138041 A | 5/2001 |

OTHER PUBLICATIONS

Gustavo Greca et al. "Double Side Sintered IGBT 650V/ 200A in a TO-247 Package for Extreme Performance and Reliability", 18th Electronics Packaging Technology Conference, 2016, pp. 1-4.

* cited by examiner

*Primary Examiner* — Amar Movva
(74) *Attorney, Agent, or Firm* — Posz Law Group, PLC

(57) ABSTRACT

A sintered member is provided between a semiconductor chip and a terminal. The sintered member is made of a sinter sheet by heating and pressing the same. The semiconductor chip is connected to the terminal via the sintered member. Convex portions are formed at a front-side surface of the semiconductor chip. Concave portions, each of which has such a shape corresponding to that of each convex portion of the semiconductor chip, are formed at a surface of the sintered member facing to the semiconductor chip.

10 Claims, 5 Drawing Sheets

FIG. 2

| | TEST SAMPLES | | | | | | | | | | | | | |
|---|---|---|---|---|---|---|---|---|---|---|---|---|---|---|
| RATIO OF WIDTH OF CONCAVE PORTION WITH RESPECT TO WIDTH OF CONVEX PORTION [%] | 300% | 300% | 300% | 200% | 200% | 150% | 100% | 100% | 100% | 80% | 100% | 80% | 50% | 50% |
| RATIO OF DEPTH OF CONCAVE PORTION WITH RESPECT TO HEIGHT OF CONVEX PORTION [%] | 300% | 200% | 100% | 300% | 100% | 300% | 300% | 100% | 80% | 100% | 50% | 80% | 100% | 50% |
| HEAT CONDUCTIVITY IS LARGER THAN SOLDER | ○ | ○ | ○ | ○ | ○ | ○ | ○ | ○ | ○ | ○ | ○ | ○ | ○ | ○ |

FIG. 3
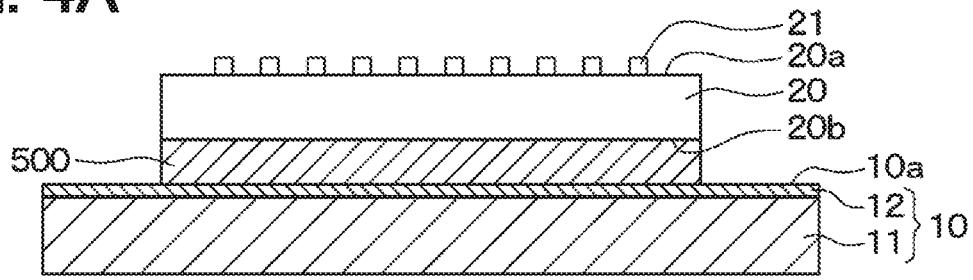
FIG. 4A
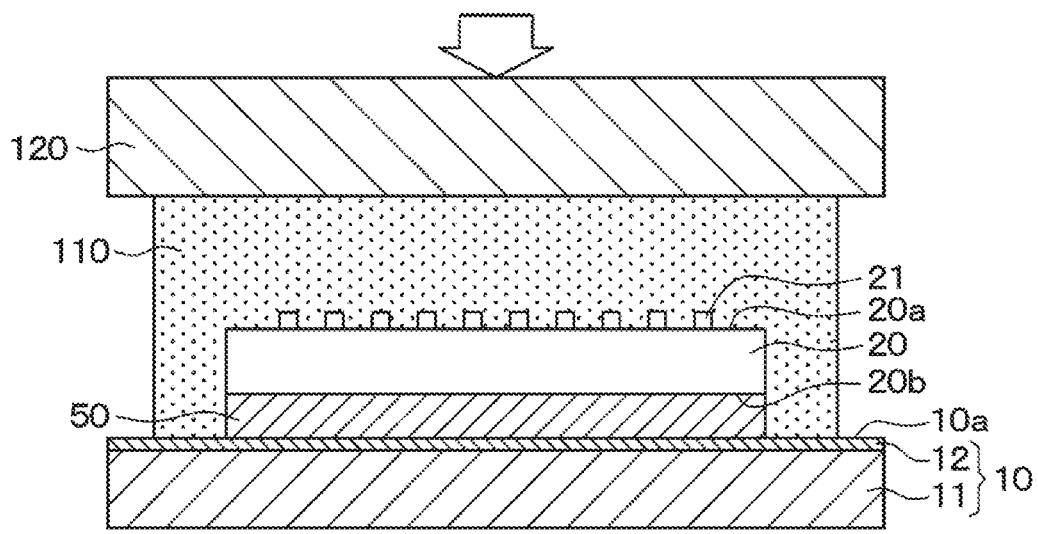
FIG. 4B

SINTER SHEET, SEMICONDUCTOR DEVICE AND MANUFACTURING METHOD THEREOF

CROSS REFERENCE TO RELATED APPLICATION

This application is based on Japanese Patent Application No. 2019-114680 filed on Jun. 20, 2019, the disclosure of which is incorporated herein by reference.

FIELD OF TECHNOLOGY

The present disclosure relates to a sinter sheet, a semiconductor device, a method for manufacturing the sinter sheet and a method for manufacturing the semiconductor device.

BACKGROUND

A semiconductor device is known in the art, according to which a sintered member made of a press-sintered body is provided between a semiconductor chip and a connected member, to which the semiconductor chip is connected. More exactly, the semiconductor chip is composed of a semiconductor element, such as, a MOSFET (Metal Oxide Semiconductor Field Effect Transistor) element, an IGBT (Insulated Gate Bipolar Transistor) element or the like. Electrode pads (surface electrodes), gate wiring patterns and so on are formed on a front-side surface of the semiconductor chip. Therefore, convex portions, which are formed by the surface electrodes, the gate wiring patterns and so on, are formed on the front-side surface of the semiconductor chip. In addition, the electrode pads are formed on a rear-side surface of the semiconductor chip.

Grooves are formed in the connected member at such surface positions opposed to the convex portions of the semiconductor chip.

It is possible in the above semiconductor device having the sintered member (the press-sintered body) to increase heat conductivity, when compared with a case in which solder is provided between the semiconductor chip and the connected member. This is because the press-sintered body is provided between the semiconductor chip and the connected member. In other words, it is possible to increase heat radiating performance from the semiconductor chip to the connected member.

The semiconductor device is manufactured in the following manner. The connected member is prepared, in which the grooves corresponding to the convex portions of the semiconductor chip are formed. A sinter sheet, which will be formed as a sintered member, is arranged on such portions of the connected member, at which the grooves are not formed. The connected member is arranged on the semiconductor chip via the sinter sheet in such a way that the convex portions are respectively opposed to (and inserted into) the grooves of the connected member via the sinter sheet. Thereafter, the sinter sheet formed between the semiconductor chip and the connected member is heated and pressed to form the sintered member and to connect the semiconductor chip to the connected member. As above, the sintered member is formed by pressing the sinter sheet, so that the sinter sheet becomes the press-sintered body.

It is possible in the above prior art to avoid a situation that stress may concentrate on the convex portions of the semiconductor chip, when the connected member including the sinter sheet is pressed, because the grooves are formed in the connected member. In other words, it is possible to avoid a situation that the semiconductor chip may be damaged and/or broken.

However, according to the manufacturing method for the semiconductor device of the above prior art, it is necessary to form the grooves in the connected member, which is connected to the semiconductor chip. Then, a manufacturing process may become complicated and a mass-production may be difficult. In recent years, another structure for the semiconductor device is demanded, so that the semiconductor chip is not easily broken.

SUMMARY OF THE DISCLOSURE

It is, therefore, an object of the present disclosure to provide a sinter sheet, a semiconductor device, a method for manufacturing the sinter sheet and a method for manufacturing the semiconductor device.

BRIEF DESCRIPTION OF THE DRAWINGS

The above and other objects, features and advantages of the present disclosure will become more apparent from the following detailed description made with reference to the accompanying drawings. In the drawings:

FIG. 2 is a table showing experimental results for a relationship among a convex portion, a concave portion and a heat conductivity, wherein the heat conductivity is larger than that of a solder;

FIG. 3 is a table also showing the experimental results for the relationship among the convex portion, the concave portion and the heat conductivity, wherein the heat conductivity is smaller than that of the solder;

FIG. 4A is a schematic cross-sectional view showing a manufacturing step for the semiconductor device of FIG. 1;

FIG. 4B is a schematic cross-sectional view showing another manufacturing step for the semiconductor device following the step of FIG. 4A;

DETAILED DESCRIPTION OF THE EMBODIMENTS

Figure 1:
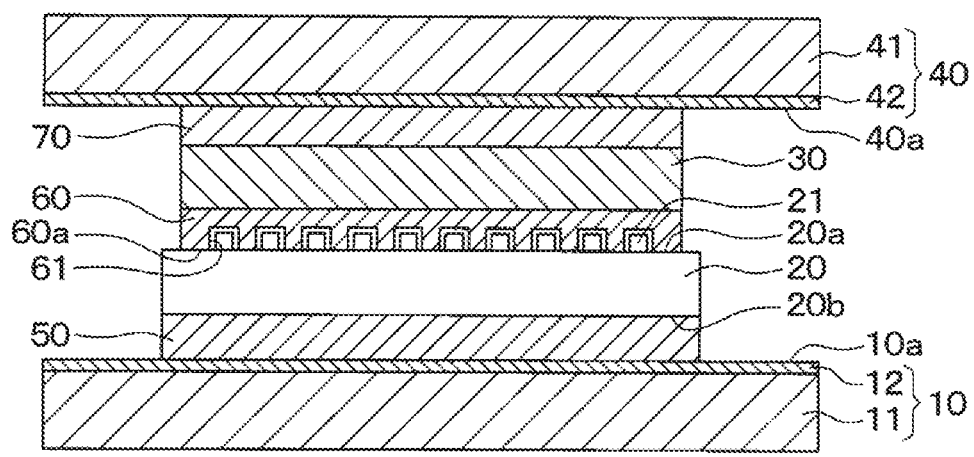
FIG. 1 is a schematic cross-sectional view showing a semiconductor device according to an embodiment of the present disclosure.

The present disclosure will be explained hereinafter by way of an embodiment with reference to the drawings. The same reference numerals are given to the same or similar structures and/or portions in each of the drawings.

Embodiment

A semiconductor device of the present embodiment includes a first supporting member 10, a semiconductor chip 20, a terminal 30, a second supporting member 40, a lower-layer sintered member 50, a middle-layer sintered member 60, an upper-layer sintered member 70 and so on.

The first supporting member 10 includes a first plate member 11 and a first plated film 12 formed on an upper-side surface of the first plate member 11, wherein the first plated film 12 forms a first plate surface 10a of the first supporting member 10. The first plate member 11 is made of metal, such as cupper, and works as a heat sink. The first plated film 12 is made of metal, such as nickel-gold alloy.

The semiconductor chip 20 is made of silicon, silicon carbide or the like. The semiconductor chip 20 is composed of a semiconductor element, such as, a MOSFET (Metal Oxide Semiconductor Field Effect Transistor) element, an IGBT (Insulated Gate Bipolar Transistor) element or the like. A front-surface electrode, a gate wiring pattern and so on are formed on a front-side surface 20a of the semiconductor chip 20, while a rear-surface electrode is formed on a rear-side surface 20b of the semiconductor chip 20, so that electric current flows from the front-side surface 20a to the rear-side surface 20b, or vice versa.

Since different types of parts, such as, the front-surface electrode, the gate wiring pattern and so on are formed on the front-side surface 20a of the semiconductor chip 20, the front-side surface 20a is not a smooth flat surface. In other words, convex portions 21 are formed on the front-side surface 20a. On the other hand, since the rear-surface electrodes are formed across the rear-side surface 20b of the semiconductor chip 20, the rear-side surface 20b is generally a flat surface. In the present disclosure, the convex portions 21 on the front-side surface 20a of the semiconductor chip 20 are also referred to as the chip-side convex portions 21.

The semiconductor chip 20 is arranged above the first plate surface 10a of the first supporting member 10 via the lower-layer sintered member 50, in such a way that the rear-side surface 20b of the semiconductor chip 20 is opposed to and in contact with the first plate surface 10a in a vertical direction of FIG. 1 (which is also referred to as a first direction).

The terminal 30 is arranged above the front-side surface 20a of the semiconductor chip 20 via the middle-layer sintered member 60. The terminal 30 is made of copper or the like and formed in a block shape. No grooves are formed in the terminal 30. In the present embodiment, the terminal 30 corresponds to a connected member, to which the semiconductor chip 20 is connected.

The second supporting member 40 is located at a position above the terminal 30 via the upper-layer sintered member 70. The second supporting member 40 includes a second plate member 41 and a second plated film 42 formed on a lower-side surface of the second plate member 41, wherein the second plated film 42 forms a second plate surface 40a of the second supporting member 40. The second plate member 41 is made of metal, such as cupper, and works as a heat sink. The second plated film 42 is made of metal, such as nickel-gold alloy.

The semiconductor device of the present embodiment has the above explained structure. Each of the lower-layer sintered member 50, the middle-layer sintered member 60 and the upper-layer sintered member 70 is composed of a press-sintered body, which is made from a sinter sheet by press-sintering the same. In the present embodiment, each of the lower-layer sintered member 50, the middle-layer sintered member 60 and the upper-layer sintered member 70 is composed of a silver press-sintered body, which is made of a silver sinter sheet by press-sintering the same.

The structure of the middle-layer sintered member 60 will be further explained. As explained above, the middle-layer sintered member 60 is located on a side of the front-side surface 20a of the semiconductor chip 20 (the upper-side surface thereof). Concave portions 61 opposing to the convex portions 21 of the semiconductor chip 20, more exactly, the concave portions 61 having such shapes corresponding to those of the convex portions 21 of the semiconductor chip 20, are formed at a lower-side surface 60a of the middle-layer sintered member 60. The lower-side surface 60a is also referred to as a first surface of the middle-layer sintered member 60 and facing in a direction to the semiconductor chip 20. In other words, the concave portions 61 are formed at the first surface 60a of the middle-layer sintered member 60 on the side directed to the semiconductor chip 20, so that the concave portions 61 are respectively opposed to the convex portions 21 of the semiconductor chip 20 in the vertical direction of FIG. 1 and in line with shapes of the convex portions 21. Each of the convex portions 21 of the semiconductor chip 20 is inserted into the respective concave portion 61 of the middle-layer sintered member 60.

In the middle-layer sintered member 60, a portion between a bottom surface of each concave portion 61 and an upper-side surface in contact with the terminal 30 (hereinafter, a thin-walled bottom portion) has a sinter density, which is smaller than a sinter density of another portion of the middle-layer sintered member 60 other than the thin-walled bottom portion. In other words, the portion other than the thin-walled bottom portion corresponds to such a portion of the middle-layer sintered member 60, which is formed between a lower-side surface in contact with the front-side surface 20a of the semiconductor chip 20 and the upper-side surface in contact with the terminal 30 (hereinafter, a thick-walled bottom portion).

According to the present embodiment having the above-explained structure for the middle-layer sintered member 60, it is possible to avoid a situation that stress may concentrate on the convex portions 21 of the semiconductor chip 20 during the manufacturing process of the middle-layer sintered member 60, when compared with a case in which the concave portions 61 are not formed in the middle-layer sintered member 60.

Experiments were made for the concave portions 61 to be formed in the middle-layer sintered member 60 and experimental results shown in FIGS. 2 and 3 have been obtained. Each of the convex portions 21 extends in a predetermined surface direction of the front-side surface 20a of the semiconductor chip 20, that is, in a direction perpendicular to a projecting direction of the convex portions 21 (the vertical direction of FIG. 1). A length of the convex portion 21 in the surface direction is also referred to as a width of the convex portion 21. In a similar manner to the convex portions 21, a length of the concave portion 61 in the surface direction of the middle-layer sintered member 60 is also referred to as a width of the concave portion 61.

As shown in FIG. 2, the heat conductivity of the middle-layer sintered member 60 is larger than that of the solder, when a ratio of the width of the concave portion 61 with respect to the width of the convex portion 21 (hereinafter, a width ratio of the concave portion 61) is smaller than 300%. On the other hand, the heat conductivity becomes smaller than that of the solder, when the width ratio of the concave portion 61 becomes 400%, as shown in FIG. 3. As a result, heat radiating performance of the middle-layer sintered member 60 may become lower than that of the solder, when the width ratio of the concave portion 61 is larger than 300%. Therefore, in the present embodiment, the width ratio of the concave portion 61 is made to be smaller than 300%.

The heat conductivity of the middle-layer sintered member 60 mainly depends on a contact surface area between the middle-layer sintered member 60 and the semiconductor chip 20. An influence generated by a ratio of a depth of the concave portion 61 with respect to a height of the convex portion 21 (hereinafter, a depth ratio of the concave portion 61) is smaller than an influence generated by the width ratio of the concave portion 61. As shown in FIG. 3, the heat conductivity of the middle-layer sintered member 60 becomes lower than that of the solder in a case that the width ratio of the concave portion 61 is 400%, even when the depth ratio of the concave portion 61 is 100%. A situation that the depth ratio of the concave portion 61 is 100% corresponds to a situation that the bottom surface of the concave portion 61 is in contact with a forward end surface of the convex portion 21.

It is possible in the present embodiment to avoid the situation that the stress may concentrate on the convex portions 21 when the concave portions 61 are formed in the middle-layer sintered member 60. In addition, the stress more hardly concentrates on the convex portions 21, when a side wall of the concave portion 61 is separated from a side wall of the convex portion 21, namely when the concave portion 61 is not in contact with the convex portion 21. Therefore, in the present embodiment, the concave portion 61 has such a size that the concave portion 61 is not brought into contact with the convex portion 21. In other words, the width ratio of the concave portion 61 is larger than 100% but smaller than 300%. The depth ratio of the concave portion 61 is larger than 100%.

A method for manufacturing the semiconductor device will be explained with reference to FIGS. 4A to 4F.

As shown in FIG. 4A, the first supporting member 10 is prepared, wherein the first plated film 12 is formed at the first plate surface 10a. The semiconductor chip 20 is then located above the first plate surface 10a via a lower-layer sinter sheet 500 of a sheet shape.

The convex portions 21 are formed at the front-side surface 20a of the semiconductor chip 20. The semiconductor chip 20 is located on the lower-side sinter sheet 500 so that the rear-side surface 20b is opposed to the first supporting member 10 in the vertical direction of FIG. 4A. The lower-side sinter sheet 500 becomes the lower-side sintered member 50, when it is sintered in the following step. In the present embodiment, the silver sheet is used as the lower-side sinter sheet 500. In a similar manner, a middle-layer sinter sheet 600 (explained below) becomes the middle-layer sintered member 60, when it is sintered. An upper-layer sinter sheet 700 (explained below) likewise becomes the upper-layer sintered member 70, when it is sintered.

As shown in FIG. 4B, a buffer member 110 is put on the first supporting member 10 to cover the semiconductor chip 20. The lower-layer sinter sheet 500 is heated and pressed by a press device 120 via the buffer member 110, so that the lower-layer sinter sheet 500 becomes the lower-layer sintered member 50. In this step, the front-side surface 20a of the semiconductor chip 20 is also pressed. However, it is avoided by the buffer member 110 that the stress may concentrate on the convex portions 21 of the semiconductor chip 20.

Figure 4C:
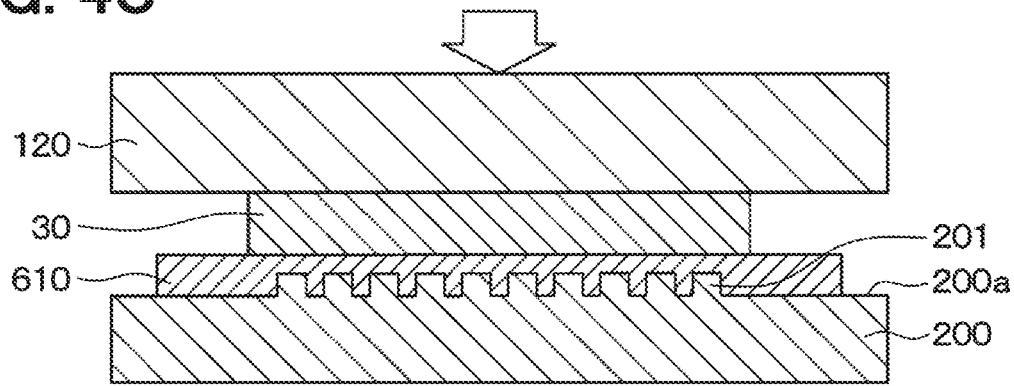
FIG. 4C is a schematic cross-sectional view showing a further manufacturing step for the semiconductor device following the step of FIG. 4B.

As shown in FIG. 4C, a jig 200 is prepared, in which convex portions 201 are formed on an upper-side surface 200a of the jig 200. The convex portions 201, which correspond to the convex portions 21 of the semiconductor chip 20, are also referred to as the jig-side convex portions.

The upper-side surface 200a of the jig 200 is also referred to as the jig surface. Sinter material 610, which forms the middle-layer sinter sheet 600, is put on the upper-side surface 200a of the jig 200. In the present embodiment, the sinter material 610 is composed of the silver sheet.

Since the convex portions 201 of the jig 200 form the concave portions 61 in the middle-layer sinter sheet 600, which will be later formed as the middle-layer sintered member 60, the convex portions 201 have such dimension necessary for forming the concave portions 61. In the present embodiment, the jig-side convex portion 201 is designed to have such dimension that the width ratio of each concave portion 61 of the middle-layer sintered member 60 is larger than 100% but smaller than 300% and the depth ratio of each concave portion 61 is larger than 100%.

The terminal 30, which is held by the press device 120, is moved down and brought into contact with the sinter material 610 (FIG. 40). Then, the sinter material 610 is heated and pressed. In the present step, the sinter material 610 is heated at a temperature of, for example, 130-180° C., and pressed at a pressure of 3-5 MPa, so that the sinter material 610 becomes a semi-sintered body. The terminal 30 is held by the press device 120, for example, by an adsorption mechanism.

Figure 4D:
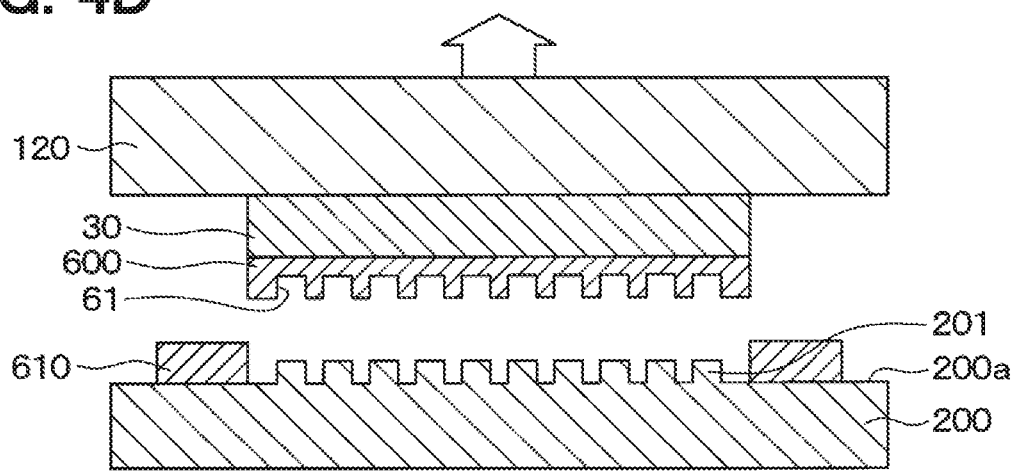
FIG. 4D is a schematic cross-sectional view showing a still further manufacturing step for the semiconductor device following the step of FIG. 4C.

Then, as shown in FIG. 4D, when the terminal 30 is lifted up in a direction away from the jig 200, the sinter material 610 is transferred to the terminal 30 to form the middle-layer sinter sheet 600. Since the convex portions 201 are formed in the jig 200, the concave portions 61 corresponding to the convex portions 201 are formed in the middle-layer sinter sheet 600. As above, the middle-layer sinter sheet 600 having the concave portions 61 corresponding to the convex portions 21 of the semiconductor chip 20 is transferred to the terminal 30.

Figure 4E:
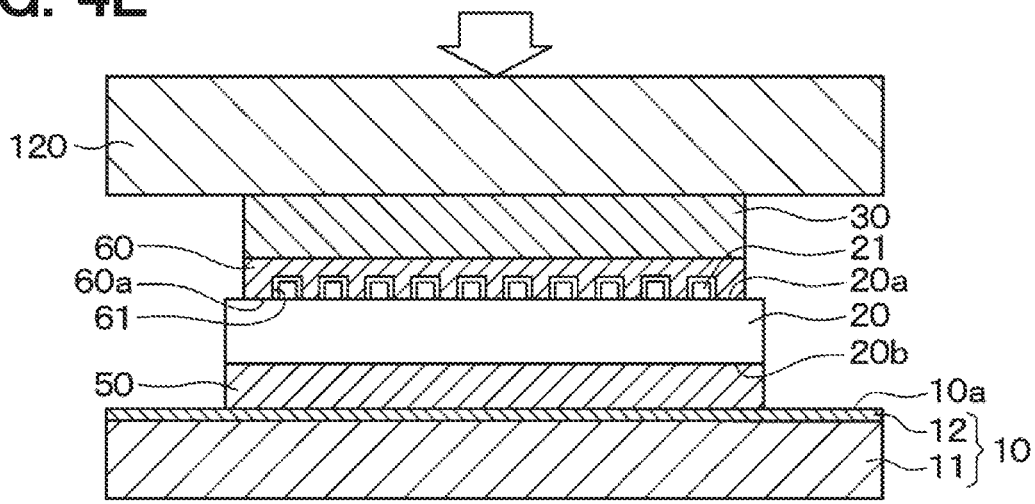
FIG. 4E is a schematic cross-sectional view showing a still further manufacturing step for the semiconductor device following the step of FIG. 4D.

Then, as shown in FIG. 4E, the terminal 30 is moved down to a position above the front-side surface 20a of the semiconductor chip 20, so that the concave portions 61 of the middle-layer sinter sheet 600 are opposed to the convex portions 21 of the semiconductor chip 20. In other words, the convex portions 21 of the semiconductor chip 20 are inserted into the respective concave portions 61 of the middle-layer sinter sheet 600. The middle-layer sinter sheet 600 is heated and pressed by the press device 120 to form the middle-layer sintered member 60. The terminal 30 is thereby connected to the semiconductor chip 20 via the middle-layer sintered member 60.

As above, the concave portions 61 are formed in the middle-layer sinter sheet 600 at such positions, at which the concave portions 61 are opposed to the convex portions 21 of the semiconductor chip 20. As a result, it is possible to avoid the situation that the stress may concentrate on the convex portions 21 of the semiconductor chip 20, when the middle-layer sinter sheet 600 is heated and pressed to form the middle-layer sintered member 60. It is, therefore, possible to avoid the situation that the semiconductor chip 20 may be damaged or broken.

In addition, since the concave portions 61 are formed in the middle-layer sinter sheet 600, the pressure applied to the thin-walled bottom portion of the middle-layer sinter sheet 600 between the bottom surface of the concave portion 61 and the upper-side surface in contact with the terminal 30 is smaller than the pressure applied to the remaining portion of the middle-layer sinter sheet 600 (the thick-walled bottom portion). As a result, the sinter density in the thin-walled bottom portion of the middle-layer sintered member 60 is smaller than that in the thick-walled bottom portion.

Figure 4F:
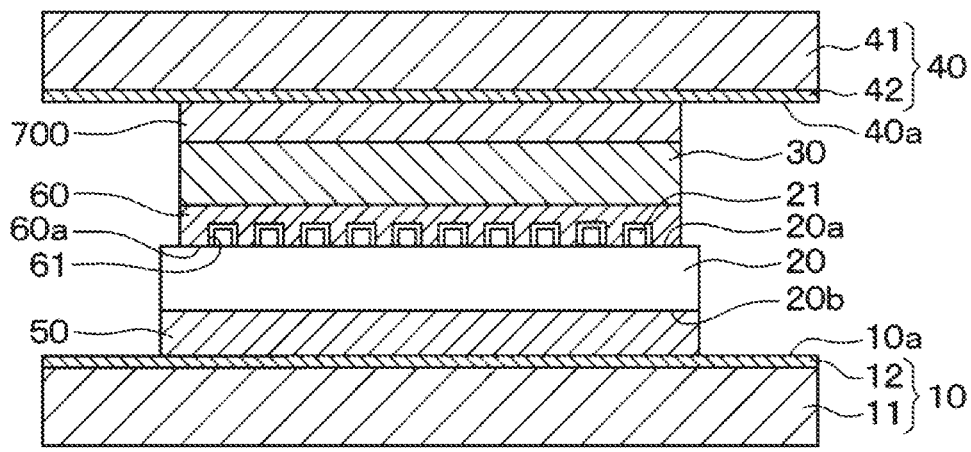
FIG. 4F is a schematic cross-sectional view showing a still further manufacturing step for the semiconductor device following the step of FIG. 4E.
Figure 4G:
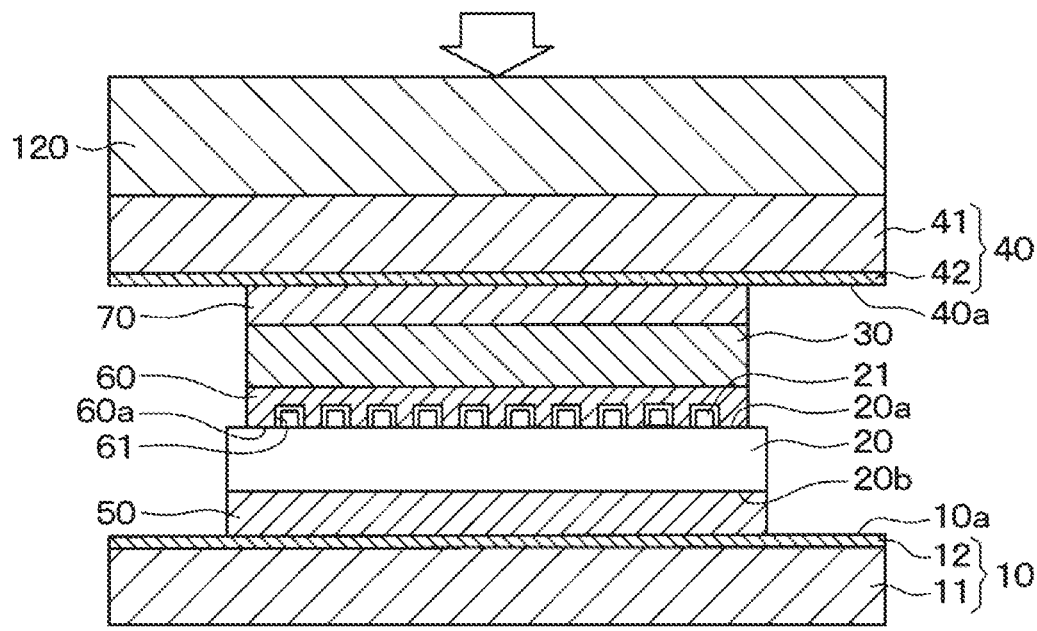
FIG. 4G is a schematic cross-sectional view showing a still further manufacturing step for the semiconductor device following the step of FIG. 4F.

Then, as shown in FIG. 4F, the second supporting member 40 is located at a position above the terminal 30 via the upper-layer sinter sheet 700. Then, as shown in FIG. 4G, the upper-layer sinter sheet 700 is heated and pressed by the press device 120 to form the upper-layer sintered member 70. The terminal 30 is thereby connected to the second supporting member 40 via the upper-layer sintered member 70. As above, the semiconductor device of the present embodiment shown in FIG. 1 is manufactured.

As explained above, the concave portions 61 corresponding to the convex portions 21 of the semiconductor chip 20 are formed in the middle-layer sinter sheet 600. In addition, the middle-layer sinter sheet 600 is located above the front-side surface 20a of the semiconductor chip 20 at such a position, at which the concave portions 61 of the middle-layer sinter sheet 600 are opposed to the convex portions 21 of the semiconductor chip 20. Then, the middle-layer sinter sheet 600 is heated and pressed in a condition that the convex portions 21 of the semiconductor chip 20 are inserted into the respective concave portions 61 of the middle-layer sinter sheet 600, to thereby form the middle-layer sintered member 60. Therefore, it is possible to avoid the situation that the stress may concentrate on the convex portions 21 of the semiconductor chip 20 during the manufacturing process and the semiconductor chip 20 may be damaged or broken.

In the present embodiment, the width ratio of the concave portions 61 is made to be smaller than 300%. It is thereby possible to avoid the situation that the heat conductivity of the middle-layer sintered member 60 becomes smaller than that of the solder. Namely, it is possible to avoid the situation that the heat radiating performance of the semiconductor chip 20 is decreased.

As above, it is only necessary in the present embodiment to prepare the jig 200 having the convex portions 201 at the upper-side surface 200a thereof. As a result, it is possible to avoid a situation that the manufacturing steps may become complicated. In addition, it becomes possible to easily mass-produce the semiconductor devices.

Further Embodiments and/or Modifications

The present disclosure is not limited to the above explained embodiment but can be further modified in various manners without departing from a spirit of the present disclosure.

For example, in the above embodiment, not silver but copper may be used as the sinter material 610. In other words, the middle-layer sintered member 60 may be composed of a press-sintered body made of copper, instead of the press-sintered body made of silver. In addition, the sinter material 610 is not necessarily formed in the sheet shape. The sinter material 610 may be made of paste-like material, in which silver particles or copper particles are mixed with solvent, such as, alcohol, ethylene glycol or the like.

In the above embodiment, the first and/or the second supporting members 10 and 40 may be replaced by a DBC (Direct Bonded Copper) substrate, an AMC (Active Metal Copper) substrate or the like.

In addition, in the above embodiment, the semiconductor device may have a structure, which does not have the terminal 30. In other words, the front-side surface 20a of the semiconductor chip 20 may be connected to the second supporting member 40 via the middle-layer sintered member 60. In such a modified structure of the semiconductor device, the second supporting member 40 corresponds to the connected member to which the semiconductor chip 20 is connected.

In addition, in the above embodiment, the structure of the middle-layer sintered member 60 may be modified in such a way that the concave portion 61 is in contact with the convex portion 21 of the semiconductor chip 20, so long as the concave portions 61 corresponding to the convex portions 21 are formed in the middle-layer sintered member 60.

In addition, the width ratio of the concave portion 61 may be changed to a value larger than 300%. Even in such a modified semiconductor device, it is possible to avoid the situation that the stress may concentrate on the convex portions 21, when compared with the case in which no concave portion is formed.

What is claimed is:

1. A sinter sheet, which will be formed as a sintered member to be located at a position between a front-side surface of a semiconductor chip and a connected member to be connected to the semiconductor chip, wherein the semiconductor chip has convex portions at the front-side surface thereof,
    wherein the sinter sheet includes:
        a first surface to be opposed to the front-side surface of the semiconductor chip; and
        concave portions formed at the first surface of the sinter sheet at such positions respectively opposed to the convex portions of the semiconductor chip, wherein the concave portions are concave shapes in the sinter sheet,
    wherein each of the concave portions has a depth ratio, of a depth from a bottom surface of the concave portion to the first surface of the sinter sheet which is not part of the concave portion with respect to a height from a top of the convex portion to an other surface of the semiconductor chip which is not part of the convex portion, of each of the convex portions,
    wherein the depth ratio of each of the concave portions is larger than 100% so that the bottom surface of each of the concave portions is not in contact with a forward end surface of each of the convex portions of the semiconductor chip.

2. A semiconductor device comprising:
    a semiconductor chip;
    a connected member, to which the semiconductor chip is connected via a sintered member; and
    convex portions formed at a front-side surface of the semiconductor chip,
    wherein the sintered member is provided between the front-side surface of the semiconductor chip and the connected member for connecting the semiconductor chip to the connected member,
    wherein the sintered member has a first surface opposed to the front-side surface of the semiconductor chip,
    wherein concave portions are formed at the first surface at such positions respectively opposed to the convex portions of the semiconductor chip, wherein the concave portions are concave shapes in the sintered member,
    wherein a thin-walled bottom portion is a part of the sintered member between a bottom surface of each concave portion and an opposite-side surface of the sintered member, which is in contact with the connected member,
    wherein a thick-walled bottom portion defines the concave portions, wherein the thick-walled bottom portion is another part of the sintered member other than the thin-walled bottom portion, wherein the thin-walled bottom portion has a sinter density which is smaller than that of the thick-walled bottom portion.

3. The semiconductor device according to claim 2, wherein each of the convex portions extends in a first direction, a width ratio of a width of each concave portion with respect to a width of the convex portion is smaller than 300%, the width of the concave portion is a length of the concave portion in a second direction, which is perpendicular to the first direction and which extends along the front-side surface of the semiconductor chip, and the width of the convex portion is a length of the convex portion in the second direction.

4. The semiconductor device according to claim 2, wherein a side wall of the concave portion formed in the sintered member is separated from a side wall of the convex portion of the semiconductor chip.

5. The semiconductor device according to claim 2, wherein the sintered member is composed of a sintered body made of silver or a sintered body made of copper.

6. A method for manufacturing a sinter sheet, which will be formed as a sintered member provided between a front-side surface of a semiconductor chip and a connected member, wherein chip-side convex portions are formed at the front-side surface of the semiconductor chip, wherein the semiconductor chip is connected to the connected member via the sintered member, and wherein the method for manufacturing the sinter sheet comprises:

a step for preparing a jig having a jig surface, at which jig-side convex portions are formed, wherein each of the jig-side convex portions has a shape corresponding to that of each chip-side convex portion;

a step for locating sinter material on the jig surface of the jig; and a step for contacting the connected member to the sinter material and heating and pressing the sinter material, in such a way that concave portions each having such a shape corresponding to that of each jig-side convex portion are formed in the sinter material and the sinter material is transferred to the connected member as the sinter sheet, wherein the concave portions are concave shapes in the sinter sheet, wherein each of the concave portions has a depth ratio, of a depth from a bottom surface of the concave portion to the first surface of the sinter sheet which is not part of the concave portion with respect to a height from a top of the convex portion to an other surface of the semiconductor chip which is not part of the convex portion, of each of the convex portions, wherein the depth ratio of each of the concave portions is larger than 100% so that the bottom surface of each of the concave portions is not in contact with a forward end surface of each of the convex portions of the semiconductor chip.

7. A method for manufacturing a semiconductor chip, which is connected to a connected member via a sintered member, comprises:

a step for preparing the semiconductor chip having chip-side convex portions at its front-side surface;

a step for preparing a jig having jig-side convex portions at its jig surface, wherein the jig-side convex portions have such shapes corresponding to those of the chip-side convex portions;

a step for locating sinter material on the jig surface;

a step for contacting the connected member to the sinter material and heating and pressing the sinter material, in such a way that concave portions each having such a shape corresponding to that of each jig-side convex portions are formed in the sinter material and the sinter material is transferred to the connected member, wherein the sinter material forms a sinter sheet;

a step for locating the connected member at a position above the front-side surface of the semiconductor chip via the sinter sheet, so that the concave portions of the sinter sheet are opposed to the chip-side convex portions and the chip-side convex portions are inserted into the concave portions, wherein the concave portions are concave shapes in the sintered member; and a step for heating and pressing the sinter sheet, to thereby form the sintered member from the sinter sheet and to connect the semiconductor chip to the connected member, wherein a thin-walled bottom portion is a part of the sintered member between a bottom surface of each concave portion and an opposite-side surface of the sintered member, which is in contact with the connected member, wherein a thick-walled bottom portion defines the concave portions, wherein the thick-walled bottom portion is another part of the sintered member other than the thin-walled bottom portion, wherein the thin-walled bottom portion has a sinter density which is smaller than that of the thick-walled bottom portion.

8. The method for manufacturing a semiconductor chip according to claim 7, wherein each of the convex portions extends in a first direction, a width ratio of a width of each concave portion with respect to a width of the convex portion is smaller than 300%, the width of the concave portion is a length of the concave portion in a second direction, which is perpendicular to the first direction and which extends along the front-side surface of the semiconductor chip, and the width of the convex portion is a length of the convex portion in the second direction.

9. The method for manufacturing a semiconductor chip according to claim 7, wherein a side wall of the concave portion formed in the sintered member is separated from a side wall of the convex portion of the semiconductor chip.

10. The method for manufacturing a semiconductor chip according to claim 7, wherein the sintered member is composed of a sintered body made of silver or a sintered body made of copper.

* * * * *